(12) United States Patent
Ma et al.

(10) Patent No.: US 7,960,218 B2
(45) Date of Patent: Jun. 14, 2011

(54) METHOD FOR FABRICATING HIGH-SPEED THIN-FILM TRANSISTORS

(75) Inventors: Zhenqiang Ma, Middleton, WI (US);
Hao-Chih Yuan, Madison, WI (US);
Guogong Wang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1302 days.

(21) Appl. No.: 11/517,812

(22) Filed: Sep. 8, 2006

(65) Prior Publication Data
US 2010/0078722 A1    Apr. 1, 2010

(51) Int. Cl.
*H01L 21/00* (2006.01)
*H01L 21/84* (2006.01)

(52) U.S. Cl. .................. 438/149; 438/479; 438/480

(58) Field of Classification Search .......... 438/149–157, 438/479, 480, E21.415, E21.614
See application file for complete search history.

(56) References Cited

U.S. PATENT DOCUMENTS

| | | |
|---|---|---|
| 4,612,083 A | 9/1986 | Yasumoto et al. |
| 4,846,931 A | 7/1989 | Gmitter et al. |
| 4,883,561 A | 11/1989 | Gmitter et al. |
| 4,980,308 A | 12/1990 | Hayashi et al. |
| 5,051,803 A | 9/1991 | Kitamura et al. |
| 5,073,230 A | 12/1991 | Maracas et al. |
| 5,087,585 A | 2/1992 | Hayashi |
| 5,286,670 A | 2/1994 | Kang et al. |
| 5,344,517 A | 9/1994 | Houlding |
| 5,376,559 A | 12/1994 | Mukai et al. |
| 5,461,243 A | 10/1995 | Ek et al. |
| 5,465,009 A | 11/1995 | Drabik et al. |
| 5,528,397 A | 6/1996 | Zavracky et al. |
| 5,759,898 A | 6/1998 | Ek et al. |
| 6,018,187 A | 1/2000 | Theil et al. |
| 6,054,734 A | 4/2000 | Aozasa et al. |
| 6,059,895 A | 5/2000 | Chu et al. |
| 6,214,733 B1 | 4/2001 | Sickmiller |
| 6,242,762 B1 | 6/2001 | Brown et al. |
| 6,410,371 B1 | 6/2002 | Yu et al. |
| 6,573,126 B2 | 6/2003 | Cheng et al. |
| 6,602,613 B1 | 8/2003 | Fitzgerald |
| 6,603,156 B2 | 8/2003 | Rim |
| 6,703,144 B2 | 3/2004 | Fitzgerald |
| 6,713,326 B2 | 3/2004 | Cheng et al. |
| 6,756,324 B1 | 6/2004 | Gates |
| 6,765,227 B1 | 7/2004 | Yu et al. |
| 6,809,358 B2 | 10/2004 | Hsieh et al. |
| 6,812,495 B2 | 11/2004 | Wada et al. |
| 6,831,263 B2 | 12/2004 | Skurnik et al. |

(Continued)

FOREIGN PATENT DOCUMENTS
WO    WO 2005/122285    12/2005

OTHER PUBLICATIONS

U.S. Appl. No. 60/577,077, filed Feb. 23, 2006, Rogers et al.
U.S. Appl. No. 60/601,061, filed Feb. 23, 2006, Rogers et al.
U.S. Appl. No. 60/650,305, filed Feb. 23, 2006, Rogers et al.
U.S. Appl. No. 60/663,391, filed Feb. 23, 2006, Rogers et al.
U.S. Appl. No. 60/677,617, filed Feb. 23, 2006, Rogers et al.

(Continued)

*Primary Examiner* — Cuong Q Nguyen
(74) *Attorney, Agent, or Firm* — Bell & Manning, LLC (57) ABSTRACT

This invention provides methods for fabricating high speed TFTs from silicon-on-insulator and bulk single crystal semiconductor substrates, such as Si(100) and Si(110) substrates. The TFTs may be designed to have a maximum frequency of oscillation of 3 GHz, or better.

20 Claims, 6 Drawing Sheets

U.S. PATENT DOCUMENTS

| | | | |
|---|---|---|---|
| 7,038,277 | B2 | 5/2006 | Chu et al. |
| 7,205,204 | B2 | 4/2007 | Ogawa et al. |
| 7,354,809 | B2 * | 4/2008 | Yuan et al. .................... 438/157 |
| 2001/0019371 | A1 | 9/2001 | Zavracky et al. |
| 2002/0096717 | A1 | 7/2002 | Chu et al. |
| 2002/0168864 | A1 | 11/2002 | Cheng et al. |
| 2003/0124815 | A1 | 7/2003 | Henley et al. |
| 2003/0168659 | A1 | 9/2003 | Lal et al. |
| 2003/0222334 | A1 | 12/2003 | Ikeda et al. |
| 2004/0146138 | A1 * | 7/2004 | Jiao ................................. 378/19 |
| 2004/0217423 | A1 | 11/2004 | Park et al. |
| 2004/0253792 | A1 | 12/2004 | Cohen et al. |
| 2005/0054121 | A1 | 3/2005 | Handy et al. |
| 2005/0082526 | A1 | 4/2005 | Bedell et al. |
| 2005/0184354 | A1 | 8/2005 | Chu et al. |
| 2005/0233493 | A1 | 10/2005 | Augusto |
| 2005/0263774 | A1 | 12/2005 | Kim et al. |
| 2006/0038182 | A1 | 2/2006 | Rogers et al. |
| 2006/0134893 | A1 | 6/2006 | Savage et al. |
| 2007/0187719 | A1 | 8/2007 | Yuan et al. |
| 2008/0315253 | A1 | 12/2008 | Yuan et al. |

OTHER PUBLICATIONS

Non Final Office Action received in U.S. Appl. No. 12/042,066, Sep. 2, 2009, pp. 1-11.

Final Office Action, received in U.S. Appl. No. 12/042,066, Mar. 10, 2010, pp. 1-14.

Advisory Action Before the Filing of an Appeal Brief, received in U.S. Appl. No. 12/042,066, May 19, 2010, pp. 1-2.

International Search Report received for PCT/US06/39831, Mar. 26, 2008.

G.K. Celler, Frontiers of Silicon-On-Insulator, Journal of Applied Physics, May 1, 2003, pp. 4955-4978, vol. 93-No. 9, American Institute of Physics, U.S.A.

A. Ikeda, Design and Measurements of Test Element Group Wafer Thinned to 10 am for 3d System in Package, Conference on Microelectronic Test Structures, Mar. 2004, pp. 161-164, vol. 17, IEEE, U.S.A.

Lei Xue et al, Three-Dimensional Integration: Technology, Use, and Issues for Mixed-Signal Applications, IEEE Transactions on Electron Devices, Mar. 2003, pp. 601-609, vol. 50-No. 3, IEEE, U.S.A.

E. Menard et al, A Printable form of silicon for high performance thin film transistors on plastic substrates, Appl. Phys. Lett., Jun. 17, 2004, pp. 5398-5400,vol. 84-No. 26, American Institute of Physics, U.S.A.

E. Menard et al, Bendable single crystal silicon thin film transistors formed by printing on plastic substrates, Appl. Phys. Lett., Feb. 25, 2005, pp. 093507-1-093507-3, vol. 86, American Institute of Physics, U.S.A.

Z.-T Zhu et al, Spin on dopants for high-performance single-crystal silicon transistors on flexible plastic substrates, Appl. Phys. Lett., Mar. 23, 2005, pp. 133507-1-133507-3, vol. 86, American Institute of Physics, U.S.A.

Yugang Sun et al, Bendable GaAs metal-semiconductor field-effect transistors formed with printed GaAs wire arrays on plastic substrates, Appl. Phys. Lett., Aug. 15, 2005, pp. 083501-1-083501-3, vol. 87, American Institute of Physics, U.S.A.

Seokwoo Jeon et al, Three-Dimensional Nanofabrication with Rubber Stamps and Conformable Photomasks, Adv. Mater., Aug. 4, 2004, pp. 1369-1373, vol. 16-No. 15, Wiley-VCH, Germany.

Yueh-Lin Loo et al, Soft, conformable electrical contacts for organic semiconductors: High-resolution plastic circuits by lamination, PNAS, Aug. 6, 2002, pp. 10252-10256, vol. 99-No. 16, PNAS, U.S.A.

Rafael Reif et al, Fabrication Technologies for Three-Dimensional Integrated Circuits, Proceedings of the International Symposium on Quality Electronic Design (ISQED'02), IEEE, Apr. 2002, IEEE.

Hao-Chih Yuan, Silicon-Based Nanomembrane Materials: The Ultimate in Strain Engineering, Topical Meeting on Silicon Monolithic Integrated Circuits in RF Systems, sponsored by the IEEE Microwave Theory and Techniques Society, San Diego, CA, Jan. 18-20, 2006, pp. 327-333, IEEE.

Issac Lauer, Double-Sided CMOS Fabrication Technology, Department of Electrical Engineering and Computer Science, Massachusetts Institute of Technology, Aug. 28, 2001, pp. 1-66, Massachusetts Institute of Technology, U.S.A.

Response to Final Office Action filed in U.S. Appl. No. 12/042,066, May 7, 2010.

Non-Final Office Action received in U.S. Appl. No. 12/877,269, Jan. 31, 2011.

U.S. Appl. No. 11/452,135, filed Jun. 13, 2006, Lagally et al.

J.F. Damlencourt, et al., "High-Quality Fully Relaxed $In_{0.65}Ga_{0.35}As$ Layers Grown on InP Using the Paramorphic Approach,:" Applied Physics Letters, vol. 75, No. 23, Dec. 6, 1999, pp. 3638-3640.

Jean-Francois Damlencourt, et al., "Paramorphic Growth: A New Approach in Mismatched Heteroepitaxy to Prepare Fully Relaxed Materials," Jpn. J. Appl. Phys., vol. 3, 1999, pp. L996-L999.

P.M. Mooney, et al., "Elastic Strain Relaxation in Free-Standing SiGe/Si Structures," Applied Physics Letters, vol. 84, No. 7, Feb. 16, 2004, pp. 1093-1095.

E. Menard, et al., "A Printable Form of Silicon for High Performance Thin Film Transistors on Plastic Substrates," vol. 84, No. 26, Jun. 28, 2004, pp. 5398-5400.

G.M. Cohen, et al., "Free Standing Silicon as a Compliant Substrate for SiGe," CMOS Front-End Materials and Process Technology. Symposium. (Mater. Res. Soc. Symposium Proceedings vol. 765), 2003, p. 141-146.

Patricia M. Mooney, et al. "Defect-Free Strained Si-on-Insulator Fabricated from Free-Standing Si/SiGe Structures," Abstract—2004 Materials Research Society Spring Meeting, Symposium B High-Mobility Group IV Materials and Devices.

P.M. Mooney, et al., "Strained Si-on-Insulator Fabricated from Elastically-Relaxed Si/SiGe Structures," Mat. Res. Soc. Symp. Proc., vol. 809, 2004 Materials Research Society, pp. B1.3.1-B1.3.6.

G.M. Cohen, et al., "Free Standing Silicon as a Compliant Substrate for SiGe," Mata Res. Soc. Symp. Proc., vol. 765, 2003 Materials Research Society, pp. D4.6.1/G1.6.1-D4.6.6/G1.6.6.

Mouloud Boudaa, et al., "Growth and Characterization of Totally Relaxed InGaAs Thick Layers on Strain-Relaxed Paramorphic InP Substrates," Journal of Electronic Materials, vol. 33, No. 7, 2004, pp. 833-839.

Y.H. Lo, "New Approach to Grow Pseudomorphic Structures Over the Critical Thickness," Appl. Phys. Lett., vol. 59, No. 18, Oct. 28, 1991, pp. 2311-2313.

F.E. Ejeckam, et al., "Lattice Engineered Compliant Substrate for Defect-Free Heteroepitaxial Growth," Appl. Phys. Lett., vol. 70, No. 13, Mar. 31, 1997, pp. 1685-1687.

A.M. Jones, et al., Long-Wavelength InGaAs Quantum Wells Grown Without Strain-Induced Warping on InGaAs Compliant Membranes above a GaAs Substrate, Applied Physics Letters, vol. 74, No. 7, Feb. 15, 1999, pp. 1000-1002.

Masini et al., "High-Performance p-i-n Ge on Si Photodetectors for the Near Infrared: From Model to Demonstration", IEEE Transactions on Electron Devices, vol. 48, No. 6, Jun. 2001.

Rauscher, et al., "Silicon PIN Diodes: A Promising Technology for UV-Optical Space Astronomy", Presentation at NHST Workshop, Apr. 11, 2003.

G.M. Cohen, et al., "Defect-Free Strained Si-on-Insulator Structures," Abstract submitted Dec. 1, 2004 for the MAR05 Meeting of the American Physical Society, available on the web in Jan. 2005.

Zhu, Z.-T., et al., "Spin on dopants for high-performance single-crystal silicon transistors on flexible plastic substrates," Applied Physics Letters, 86, 133507, Mar. 23, 2005.

Mack, S., et al., "Mechanically flexible thin-film transistors that use ultrathin ribbons of silicon derived from bulk wafers," Applied Physics Letters 88, 213101, May 22, 2006.

Ahn, Jong-Hyun, et al., "High-Speed Mechanically Flexible Single-Crystal Silicon Thin-Film Transistors on Plastic Substrates," IEEE Electron Device Letters, vol. 27, No. 6, Jun. 2006.

International Search Report from PCT/US2007/077525, mailed Feb. 25, 2008.

* cited by examiner

METHOD FOR FABRICATING HIGH-SPEED THIN-FILM TRANSISTORS

STATEMENT OF GOVERNMENT RIGHTS

Research funding was provided for this invention by the National Science Foundation (NSF) under grant number 0323717. The United States government has certain rights in this invention.

FIELD OF THE INVENTION

This invention pertains generally to the field of high-speed thin-film transistors (TFTs) and methods for fabricating the same.

BACKGROUND

Flexible micro-/macro-electronics that are light-weight, robust, and capable of being folded or rolled up for easy carriage, storage, and attaching to uneven surfaces have been an important pursuit of research in the past decade. Some of the potential applications, such as flexible displays and radio-frequency identification tags, require modest electrical performance of the active TFTs, while low cost and the capability of large-area fabrication are the primary concerns. See, for example, Gernier et al., Science 265, 1682 91994); Drury et al., Appl. Phys. Lett. 73, 108 91998); and Voss, Nature 407, 422 (2000). For these applications, flexible electronics using organic semiconductors, amorphous silicon (α-Si), and poly-crystal silicon (poly-Si) have shown tremendous promise. See, for example, Baude et al., Appl. Phys. Lett. 82, 3964 (2003); Gelinck et al., Nature Mater. 3, 106 (2004); Chen et al., Nature 423, 136 (2003); and Chuang et al., Proceedings of SPIE 5801, 234 (2005).

On the other end of the scale, however, lie applications that require reasonable cost but high performance radio frequency (RF) circuitry and can operate in the several hundred MHz to multiple GHz and even tens of GHz regimes. One example is the large military active antenna for surveillance systems, unmanned aerial vehicles and space-based radars. See, for example, Reuss et al, Proceedings of the IEEE 93, 1239 (2005). Flexible electronics are ideal for these applications since low weight, small stow volume, and the ability to conform to complex shapes are crucial. The active circuitry for these antennas are desirably operated in the ultra high frequency (UHF) (~500 MHz) and higher RF frequency range (several GHz). Such a demand on higher operation frequencies has made it impractical to use organic semiconductors, α-Si and poly-Si in TFT applications.

The mobility of electrons and holes in organic materials is rather low. As a result, high-performance (high speed and low power consumption) flexible electronics cannot be realized with these materials, despite the fact that these materials are easy to use on flexible substrates (e.g., can be printed or spun-on at low-temperatures). Similarly, due to poor microstructure, the mobility of α-Si is also very low (<10 cm$^2$/V-s) and prevents it from being used in high-performance applications. The mobility of poly-Si is much higher than that of α-Si; however, it requires higher processing temperatures than that of α-Si. The required higher-temperature processing of poly-Si has excluded it from being used on a number of desirable low-temperature substrates, like plastic (e.g., PET and PEN). Furthermore, the mobility of poly-Si is still not high enough for this type of material to be used in many high-performance, very-large-area applications.

Currently, the large-area antennas mentioned above are built by hardwiring the high-performance; stand-alone units which are fabricated using highly developed integrated circuit (IC) technology. It is not until recently that high quality, single-crystal semiconductors have been monolithically integrated onto flexible polymer substrates. See, for example, Tilke et al, Appl. Phys. Lett. 77, 558 (2000); Menard et al., Appl. Phys. Lett. 84, 5398 (2004); Menard et al., Appl. Phys. Lett. 86, 093507 (2005); and Sun et al, Appl. Phys. Lett. 87, 083501 (2005). Electron mobility as high as 270 cm$^2$/V-sec has been demonstrated on TFTs using a single-crystal Si channel with improved ohmic contacts for the source and drain. See, for example, Zhu et al, Appl. Phys. Lett. 86, 133507 (2005). However, to date, no flexible Si-based TFTs have been demonstrated capable of operating at RF frequencies (e.g., >1 GHz).

Recently, advances on releasing and transferring single-crystal Si template layers from silicon-on-insulator (SOI) substrates have opened new possibilities for employing single-crystal silicon in flexible electronics. However, many significant challenges need to be overcome before any practical application employing these new materials can be realized. First, the commercial SOI substrates, which are designed for advanced complementary metal-oxide semiconductor (CMOS) field-effect transistor applications (e.g., microprocessors), are greater than 4 to 6 times more expensive than regular Si substrates. Consequently, the essential requirement of low cost for flexible electronics using these materials cannot not be satisfied. The low-cost requirement will also not be attained by using other materials that are not mass-produced, like Si(111) substrates, because the custom manufacturing of these substrates also implies high cost. Besides the availability issue of Si(111), the lower carrier mobility and higher interface states will lower the device speed, and the current complicated material processing procedures of Si(111) over Si(100) will present significant disadvantages of employing the Si(111) substrates for low-cost flexible electronics. Furthermore, the material process for Si(111) substrates for TFT fabrication is not compatible with the commercial Si CMOS process. Thus, a need exists for a method that is compatible with the Si CMOS process and capable of deriving a single-crystal Si layer from low-cost, commercially produced silicon substrates, such as Si(100) and Si(110).

SUMMARY

This invention provides methods for fabricating high-speed TFTs on flexible plastic substrates. The present methods overcome limitations of prior TFTs by carrying out various high-temperature processing steps to form source regions, drain regions and gate channel regions in a thin single crystal silicon layer (i.e., a "nanomembrane") prior to the release of the thin single crystal silicon layer from an underlying substrate and transfer of the released thin single crystal silicon layer to a thin polymer substrate. These high-temperature processing steps include dopant (e.g., boron, phosphor and/or arsenic) diffusion, ion implantation and annealing steps that are typically carried out at temperatures of at least 500° C.

The methods further provide low-temperature (e.g., ≦200° C.) processing steps that allow for the formation of a gate stack and electrodes on the thin single crystal silicon layer at processing temperatures low enough for the polymer substrate to withstand. These low-temperature processing steps include the low-temperature deposition of a gate dielectric layer. For example, the gate dielectric layer may be deposited at a temperature of about 150° C., or less, a temperature of about 120° C. or less, or even at room temperature. In some of the present TFTs, SiO (silicon monoxide) is used as the gate dielectric. SiO has important advantages over conventional gate dielectric materials. For example, SiO has a higher dielectric constant (5.8 versus 3.9) and better thickness uniformity than epoxy dielectrics, such as SU-8, and can be deposited (e.g., evaporated, or sputtered) at temperatures much lower than $SiO_2$.

TFTs made in accordance with the present methods have low parasitic source and drain resistances and low gate threshold voltages ($V_{th}$) and, therefore, are well suited for use in high-speed applications, such as liquid crystal displays, digital signage, and military applications, including antenna for surveillance systems, unmanned vehicles, space-based radars, and the like. In some embodiments, the TFTs provide a maximum frequency of oscillation ($f_{max}$) of at least 1 GHz. This includes TFTs that provide a $f_{max}$ of at least 3 GHz and at least 10 GHz. In some embodiments, the TFTs provide a transition frequency ($f_T$) of at least about 1.5 GHz. This includes TFTs that provide an $f_T$ of at least about 2.0 GHz, at least about 5 GHz, and even at least about 10 GHz.

The TFTs may be fabricated from a thin single crystal silicon device layer supported by a sacrificial layer, such as a silicon device layer over a buried oxide layer (BOX) in a silicon-on-insulator (SOI) substrate. In these embodiments a source region, a drain region, and a gate channel region which connects the source and drain regions may be formed in the device layer prior to the release of the device layer from the underlying substrate via the removal (e.g., etching) of the BOX layer. Alternatively, the TFTs may be fabricated from a bulk silicon wafer. In these embodiments, a hydrogen implantation layer is created below the top surface of the silicon wafer, such that a device layer is defined between the top surface of the wafer and the hydrogen implantation layer. A source region, a drain region, and a gate channel region connecting the source and drain regions may be formed in the device layer prior to the release of the device layer via splitting at the hydrogen implantation layer. The latter embodiment has the advantage that it enables the use of widespread silicon processing infrastructure that relies on readily available, low cost bulk Si(100) wafers. However, other Si wafers, including Si(110) wafers, may also be employed. In addition, compared to SOI-based methods where the SOI substrate can be used only once for providing a silicon nanomembrane, a bulk silicon substrate can be repeatedly reused to fabricate many nanomembranes, reducing the cost of material supplies.

Further objects, features and advantages of the invention will be apparent from the following detailed description when taken in conjunction with the accompanying drawings.

BRIEF DESCRIPTION OF THE DRAWINGS

FIG. 3. (a) Optical-microscope image of a finished RF TFT on a polymer substrate. (b) Schematic illustration of the cross-section of the single-crystal Si RF TFT.

DETAILED DESCRIPTION

This invention provides methods for fabricating high-speed TFTs on flexible plastic substrates. The present methods carry out various high-temperature processing steps to form source regions, drain regions, and gate channel regions in a thin single crystal silicon layer prior to the release of the thin single crystal silicon layer from an underlying substrate, followed by low-temperature processing steps that allow for the formation of a gate stack and electrodes on the thin single crystal silicon layer after it has been transferred to a thin polymer film. The TFTs are capable of providing a maximum frequency of oscillation ($f_{max}$) of at least 1 GHz. This includes TFTs that provide a $f_{max}$ of at least, 2 GHz, at least 3 GHz and at least 10 GHz.

The TFTs may be fabricated from a single crystal silicon layer supported by a sacrificial layer. A method for fabricating a TFT using this method is described in the Example below.

Figure 1:
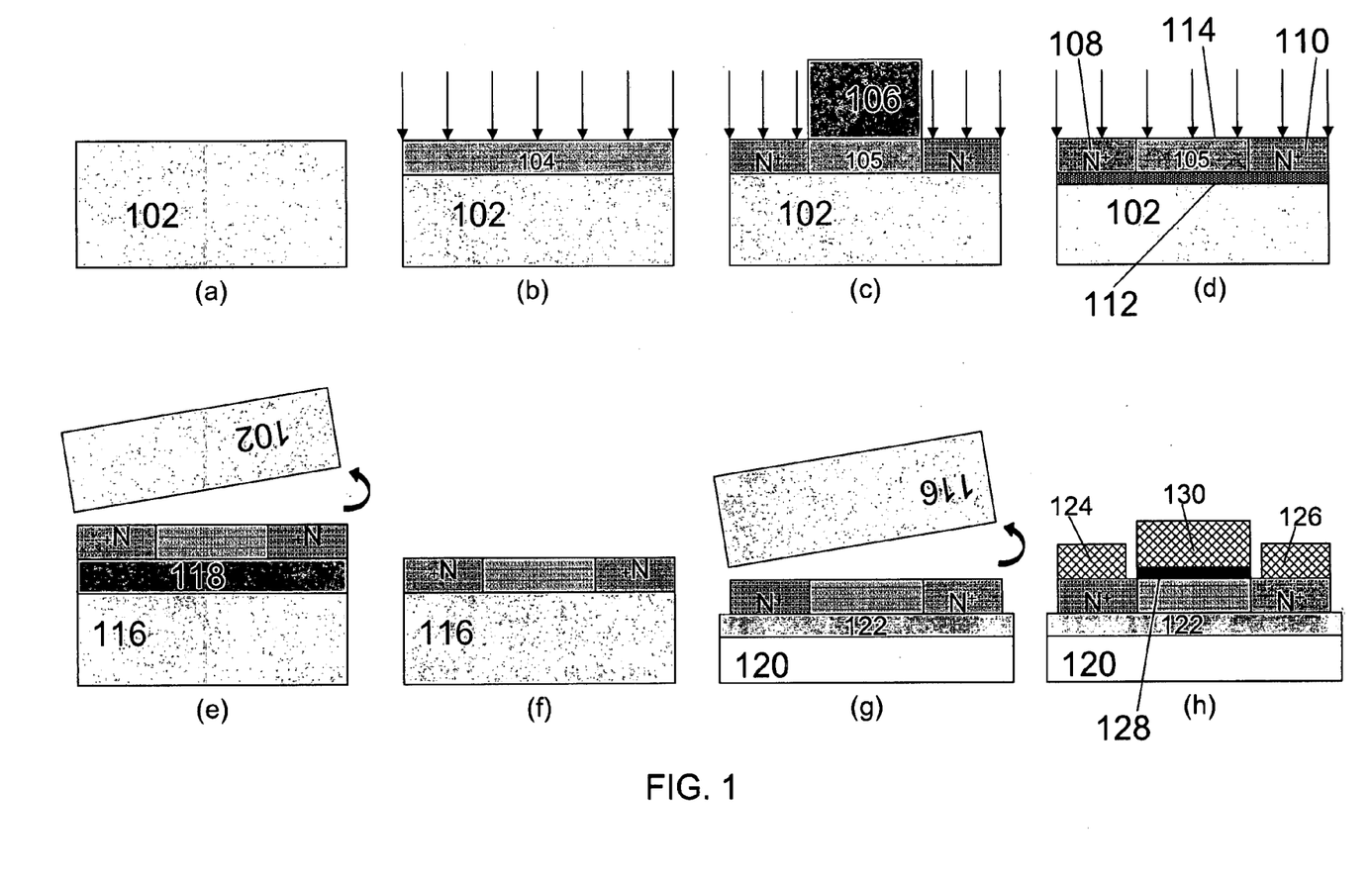
FIG. 1 is a schematic diagram of a process flow for fabricating TFTs from single crystal silicon thin films and plastic substrates.

Alternatively, the TFTs may be fabricated from a bulk silicon wafer. FIGS. 1 and 2 show process flow diagrams for two such methods. As shown in FIG. 1, the methods begin using a bulk silicon substrate 102, which for the purposes of this example is an Si(100) substrate (step (a)). Ion implantation is used to lightly dope a top layer 104 of silicon substrate to provide a gate channel region 105 with a suitable $V_{th}$ (step (b)). Using a mask 106, a source region 108 and a drain region 110 are formed by ion implantation to selectively heavily dope areas of top layer 104 (step (c)). After a high-temperature anneal of the doped top layer, high-dose hydrogen ($H_2$) implantation is used to create a hydrogen implantation layer 112 below the top surface 114 of the silicon substrate (step (d)). This defines a device layer in the substrate corresponding to the doped top layer 104. The device layer is then bonded to a second silicon substrate 116 having a thin oxide layer 118 on its upper surface. The strong bonding between the two wafers occurs at room temperature due to van der Waals force. A thermal annealing of at least 400° C. is performed to split the device layer 104 from the silicon substrate 102 along the hydrogen implantation layer to release the device layer (step (e)). A higher temperature annealing of about 1100° C. may be performed to strengthen the bonding between the device layer 104 and the second substrate 116. However, it is not absolutely needed or a lower-temperature annealing may be used instead. The thin oxide layer 118 is subsequently removed, for example using an HF etch, such that the device layer 104 falls onto underlying silicon substrate 116 (step (f)). The device layer is then transferred to a low-temperature polymer substrate 120, such as a polyethylene terephthalate (PET) substrate, optionally having a adhesive coating 122 on its upper surface (step (g)). Finally, a source electrode 124, a drain electrode 126, a gate dielectric 128 and a top gate electrode 130 are grown on the device layer 104, under low-temperature processing conditions, to provide a top-gated TFT.

Figure 2:
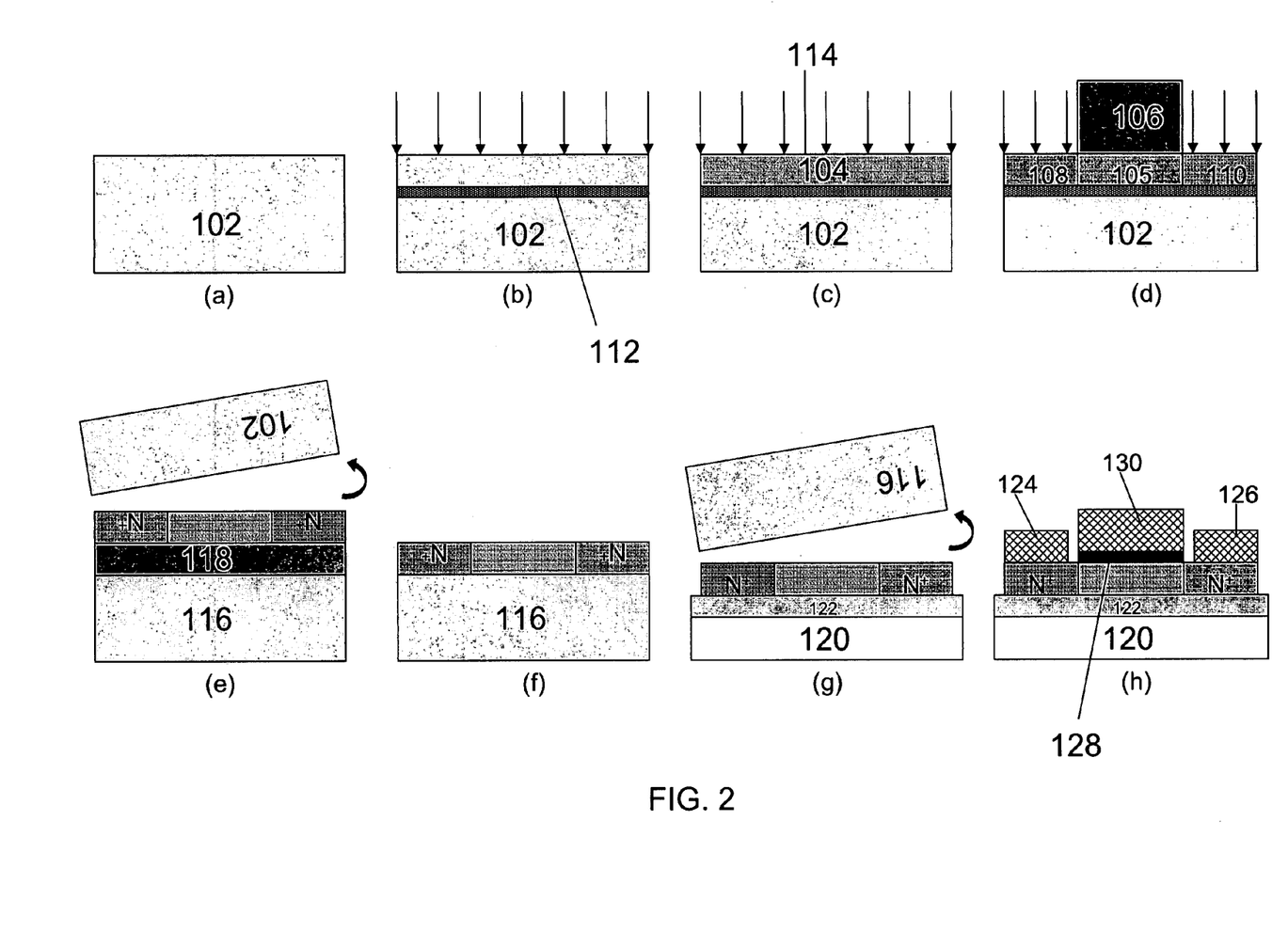
FIG. 2 is a schematic diagram of an alternative process flow for fabricating TFTs from single crystal silicon thin films and plastic substrates.

As shown in FIG. 2, the order of the steps used to form the doped device layer 104 may be carried out in a different order.

For example, in the flow process depicted in FIG. 2, the step of creating the hydrogen implantation layer 112 occurs before the doping steps used to form the source, drain and gate channel regions 108, 110 and 105.

Although the substrate used in the methods of FIGS. 1 and 2 is a Si(100) wafer, the process may also be carried out using other silicon wafers, such as a Si(110) wafer, for which high hole mobility is favored. In some embodiments of the present invention, complementary MOSFETs (CMOS) can be fabricated by combining Si(100) and Si(110) substrates. In these embodiments the thin film transistors include an n-channel transistor and a p-channel transistor in communication (e.g., wired together) to provide a CMOS transistor. Thus, the device layer of the TFT includes a first set of source, drain and gate channel regions and a second set of source, drain and gate channel regions. The n-channel transistor and the p-channel transistor may be incorporated into the same surface of the device layer or into different (e.g., opposing) surfaces.

The hydrogen implantation layer may be formed by hydrogen implantation using a hydrogen induced Smart Cut process, as described in Bruel et al., Proceedings 1995 IEEE International SOI Conference, 178 (1995). Since the hydrogen implantation layer is intended to produce a splitting plane in the wafer, no mask patterning is needed for this step. The depth of the hydrogen implantation layer will determine the thickness of the thin single crystal device layer. Typically, the device layer will be no more than about 400 nm thick. This includes embodiments where the device layer is no more than about 200 nm thick, no more than about 100 nm thick, no more than about 50 nm thick, or even no more than about 30 nm thick.

As shown in FIGS. 1 and 2, dopant ion implantation is carried out in two steps. In the first step, the top layer of the wafer undergoes heavy doping with, for example, phosphorus (n-type dopant) for the formation of source and drain regions and, in the second step, the wafer undergoes light doping (the type and doping levels depending on the thickness of the gate dielectric and gate metal function) for the gate channel region to obtain a low gate threshold voltage. These two doping steps may also be carried out in the reverse order. The implanted dopants may be restricted to the to-be released device layer by properly adjusting the dopant implantation energy. After annealing, the dopants will be redistributed and the lattice damage caused by the ion implantation will be repaired (re-crystallized).

The top surface of the implanted wafer having at least one source region, at least one drain region and at least one gate channel region defined therein, may then be bonded to an oxidized silicon handling wafer for splitting. Since the buried oxide is subsequently removed, no high-temperature annealing (1100° C.), as routinely done for creating commercial SOI substrates, is needed. The removal of the buried oxide to re-release the device layer may be carried out by etching away the oxide with, for example, liquid or vapor HF. After the device layer is re-released it may be transferred to a flexible plastic substrate for further, low-temperature, processing. For example, the, now exposed, bottom surface of the device layer may be contacted by an adhesive-coated (e.g., SU-8 coated) plastic substrate, such as PET, or PEN. The substrate is desirably thin enough to be mechanically flexible, typically having a thickness of no more than about 200 µm.

Once the device layer has been transferred to the plastic substrate, the gate stack and the source and drain electrodes may be formed. The formation of a gate stack at temperatures sufficiently low to be carried out on a plastic substrate is a processing step that has limited the successful production of high speed TFTs in the past. However, the present invention provides low-temperature processing steps for the formation of a gate stack on a device layer supported by a plastic substrate by using SiO as the gate dielectric material. The SiO may be deposited over the gate channel region by sputtering or evaporating followed by lift off or dry etching. During this process the polymer substrate temperature may be maintained well below 200° C. The source, drain and gate electrodes may then be formed using conventional metal deposition processes.

The following illustrative examples are intended to further exemplify the methods for fabricating high-speed TFTs. These examples should be not interpreted as limiting the scope of the methods or the TFTs disclosed herein.

Example 1

Fabrication of a High-Speed TFT from a Silicon-on-Insulator Substrate

In order to integrate single-crystal Si onto polymer substrate, a silicon-on-insulator (SOI) substrate was used as a starting substrate from which the buried oxide (BOX) layer was selectively removed after high-temperature processing. The thin single crystal silicon device layer (Si nanomembrane) was then transferred to the polymer host by a simple dry printing technique (without using stamps as the transfer tool), as described in Yuan et al., Appl. Phys. 100, 013708 (2006). This transfer technique brings the device layer upside-down onto the host substrate and is simple, effective, and can be implemented to full-wafer size and to large-area host substrates.

In this process of making n-type TFTs, the source and drain regions were first formed on a 200 nm SOI substrate via phosphorus ion implantation with a dose of $4\times10^{15}$ cm$^{-2}$ and an energy of 40 keV. The source and drain regions had a separation of 4 µm. The SOI substrate was then annealed in a horizontal furnace at 850° C. for 45 minutes in an $N_2$ ambient. By forming the source and drain regions prior to the formation of the gate-dielectric stack, the high-temperature processing procedures needed to achieve low-contact resistance were carried out before the device layer was transferred to a low-temperature polymer substrate. Since ion implantation is a mature technique, p-type (n-type is described herein) and thus complimentary geometry can also be achieved for more functionality and low-power applications on flexible substrates. After thermal annealing for activating the implanted dopants, the device layer was patterned into strips or in the form of mesh holes followed by the BOX removal in aqueous 49% HF.

The polymer host used in this study was polyethylene terephthalate (PET). The PET was rinsed with acetone, iso propyl alcohol, and deionized (DI) water, followed by a 10-second $O_2$ plasma treatment (Unaxis 790, 50 W/100 ml/20 sccm $O_2$). A thin layer of SU-8-2 epoxy (Microchem) was then spun on at 4000 rpm. The SOI, now with silicon device layer settled down on the silicon handling substrate, was brought face-to-face against the epoxy layer. The device layer was transferred to the polymer host by gently pressing and peeling off the silicon handling substrate. Finally, the SU-8-2 was exposed under UV light and became fully cross-linked after baking at 115° C. The device active areas (200 nm Si) were formed by optical photolithography and dry plasma etched ($SF_6/O_2$) down to the SU-8-2 layer. The gate stack consisting of 200 nm amorphous silicon mono-oxide (SiO), 40 nm Ti, and 300 nm Au was formed with e-beam evaporation at a pressure under $10^{-6}$ torr followed by lift-off. Evaporated SiO is capable of being deposited at room temperature.

Figure 3:
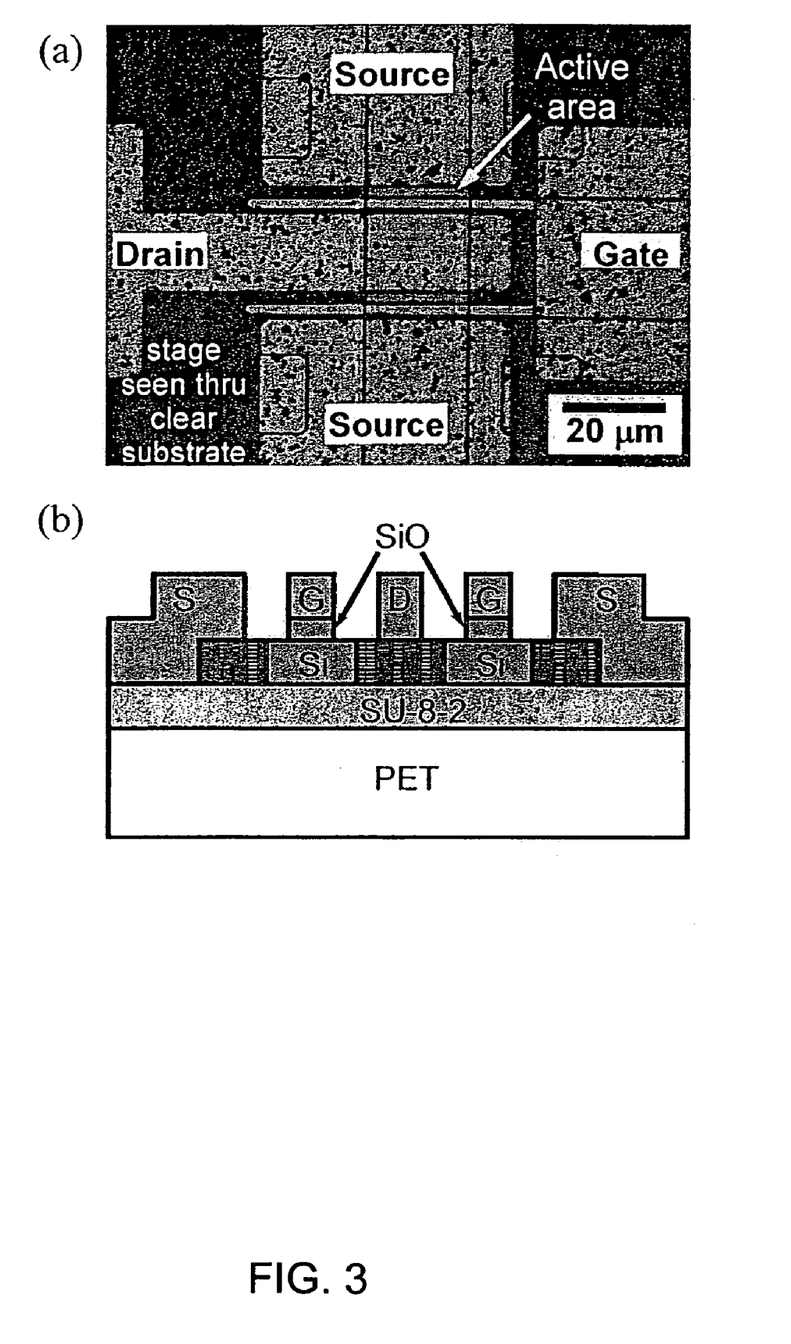

As a result, the use of SiO makes it possible to keep the polymer substrate at low-temperature throughout the gate stack formation. The lift-off process ensures minimum gate real estate (gate electrode length=2 µm). In this case only the π-shape, 2-finger gates were left on the substrate so the undesired bending and curling of the flexible substrate possibly created by the large stress gate stack could be minimized. Finally, since the heavily-doped, source and drain regions were formed even before the transfer, the last process step to finish the TFTs was to deposit a 40-nm Ti layer and a 500-nm Au layer as the source and drain electrodes followed by lift-off. FIG. 3 shows the optical microscope image and the schematic illustration of the cross-section of a finished TFT made in accordance with this Example.

Figure 4:
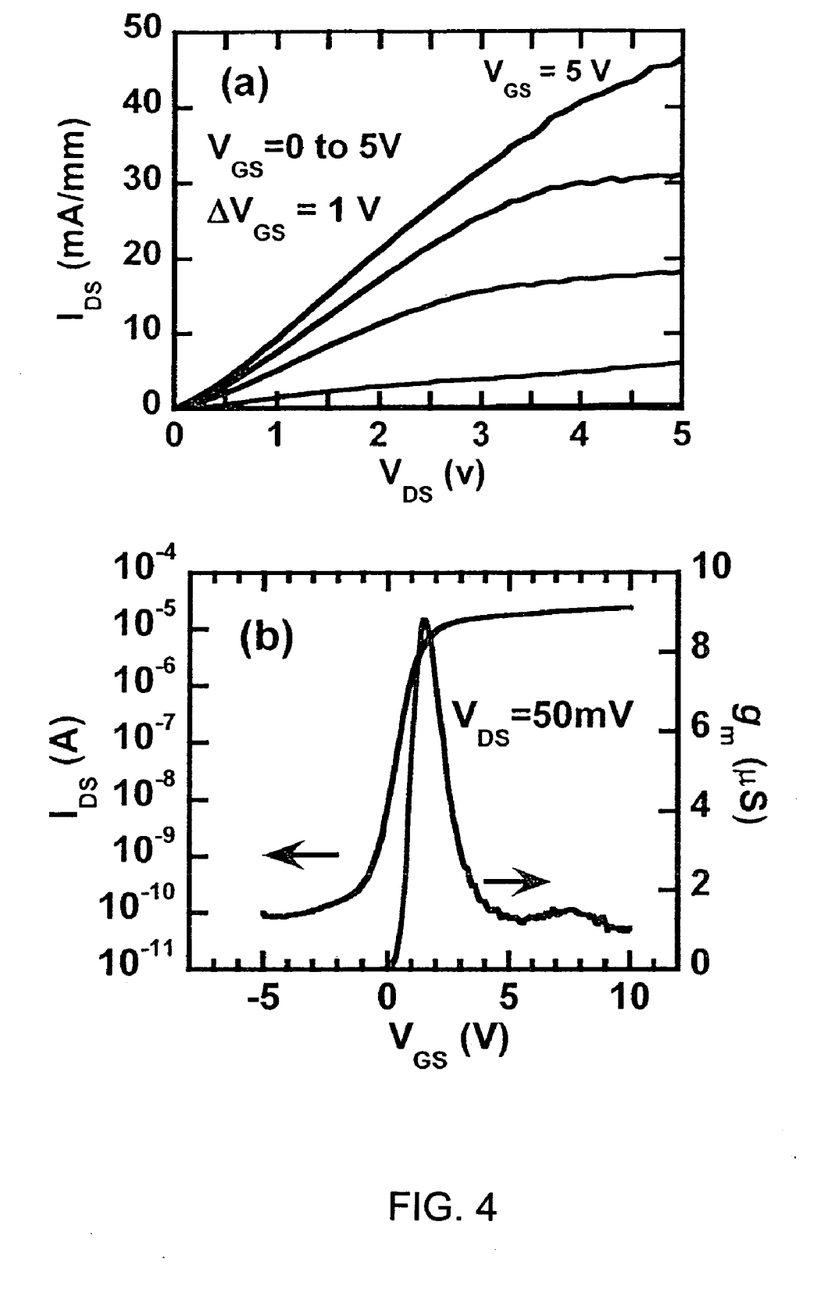
FIG. 4. Electrical characterizations of a top-gated RF TFT on a polymer substrate. (a) Normalized I-V characteristics of the RF TFT with physical $L_G$=2 µm and $W_G$=60 µm. (b) Transfer characteristics of the TFT measured at $V_{DS}$=50 mV.

Transfer length method (TLM) was used to evaluate the contact resistance and the sheet resistance of the implanted regions. The extracted contact resistivity and sheet resistance were $4.6 \times 10^{-4}$ $\Omega/cm^2$ and 94.5 $\Omega$-cm, respectively. Even lower resistance can be achieved with optimized dopant profile and annealing conditions. FIG. 4(a) presents the normalized current-voltage characteristics of a 2-finger TFT that has the physical gate length of 2 µm and gate width of 2×30 µm. Much higher current level was achieved on these top-gated TFTs compared with the published results from bottom-gated single-crystal Si TFTs. A low gate leakage current (<1 nA) proved that the 200 nm thick SiO dielectric layer provided good coverage on the 150 to 200 nm step height at the edge of the active area. The step height was somewhat smaller than the Si thickness, presumably due to the Si thin-film being pushed down into the SU-8-2 during the printing transfer. FIG. 4(b) presents the transfer characteristics at $V_{DS}$=50 mV. The $I_{DS}$ is shown in logarithmic scale and an $I_{ON}/I_{OFF}$ ratio larger than $10^5$ is demonstrated. Threshold voltage and subthreshold swing were extracted from the measurement results and were 0.5 V and 450 mV/decade, respectively. High subthreshold swing is an indication of high interface-trap density between SiO and Si. The field-effect mobility was calculated using $u_{FE}=L_G \cdot g_m/(W_G \cdot C_{ox} \cdot V_{DS})$ using a dielectric constant of SiO as 5.8. The calculated electron mobility was 230 $cm^2$/V-sec.

Figure 5:
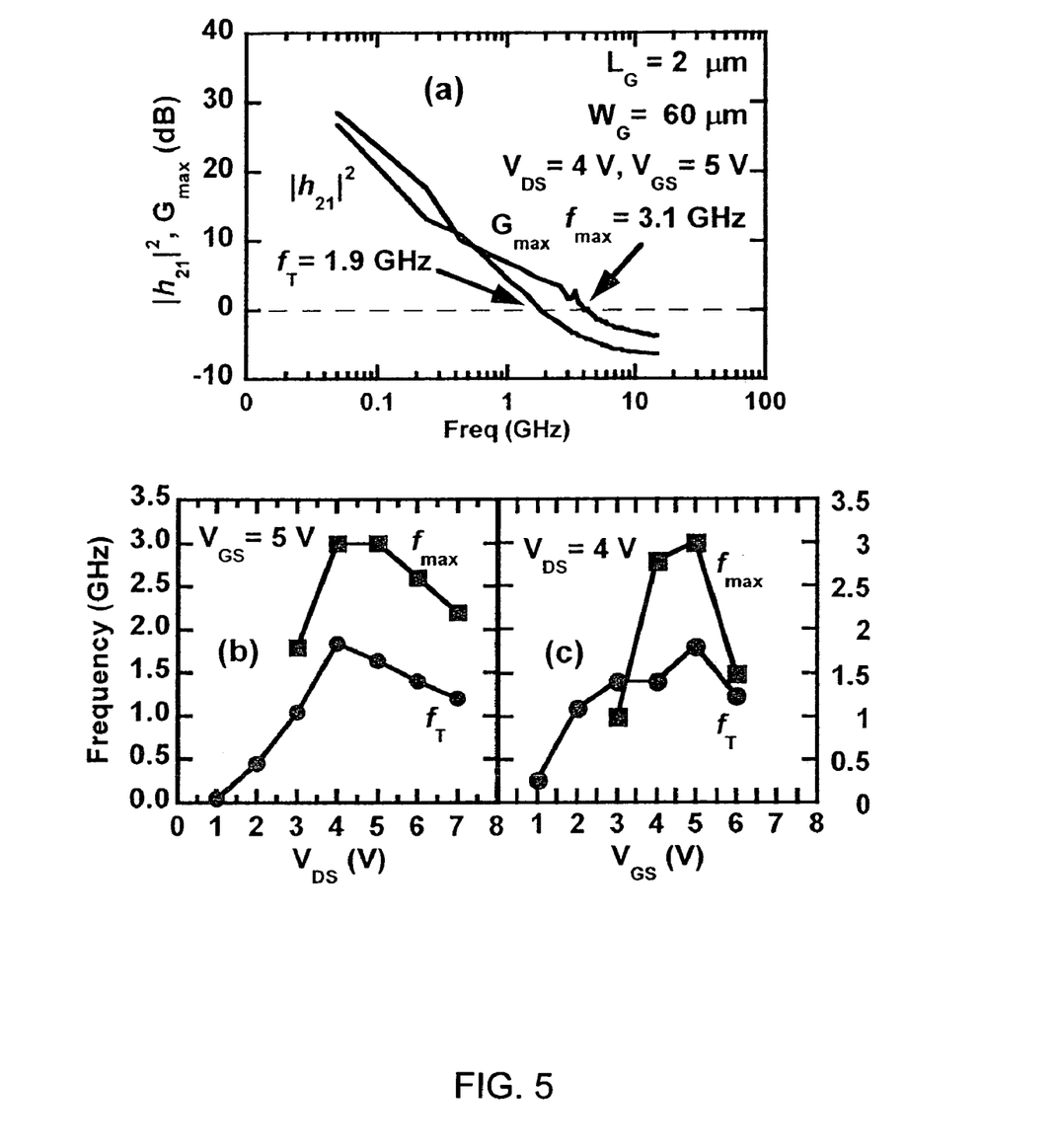
FIG. 5. AC small-signal RF characteristics of a top-gated RF TFT ($L_G$=2 µm and $W_G$=60 µm) on polymer substrate. (a) Current gain ($|h_{21}|^2$) and power gain ($G_{max}$) as a function of frequency measured at $V_{DS}$=4 V and $V_{GS}$=5 V. (b) $f_T$ and $f_{max}$ as a function of $V_{DS}$ at $V_{GS}$=5 V. (c) $f_T$ and $f_{max}$ as a function of $V_{GS}$ at $V_{DS}$=4 V.

In order to investigate the RF characteristics of the TFTs, small-signal S-parameters were measured on the polymer substrate in the frequency range of 45 MHz to 40 GHz with an Agilent E8364A network analyzer using 100 µm pitch GSG probes (Cascade Microtech). The reference plane was calibrated to the probe's tip by SOLT calibration using impedance standard substrate (GGB Industries Inc.) to eliminate possible errors from the network analyzer, cables, and probes. FIG. 5(a) presents the current gain ($|h_{21}|^2$) and the power gain ($G_{max}$) calculated from the de-embedded S-parameters as a function of frequency at a bias point of $V_{DS}$=4 V and $V_{GS}$=5 V. An $f_T$ as high as 1.9 GHz and $f_{max}$ of 3.1 GHz were obtained from the RF TFT on the polymer substrate. FIGS. 5(b) and (c) show the bias dependence characteristics of the $f_T$ and $f_{max}$. Both $f_T$ and $f_{max}$ peak at $V_{DS}$=4 V and $V_{GS}$=5 V.

In summary, the present methods provide an inexpensive fabrication process to realize high-performance, single-crystal silicon RF TFTs on flexible polymer substrates. In the methods, a gate stack may be formed after high-temperature source and drain region formation, which achieves low-resistivity source and drain contact and low sheet-resistance via ion implantation. A metal/SiO gate stack formed by evaporation and lift-off may be used to keep the substrate temperature below 120° C. and to keep the residue stress to the minimum level after the device layer is transferred onto the polymer substrate. With this process, top-gated silicon RF TFTs on flexible polymer substrates demonstrating high electron mobility, high current drive capability and high frequency response characteristics with record high $f_T$ of 1.9 GHz and $f_{max}$~of 3.1 GHz, have been realized. These characteristics show the potential to bridge flexible electronics with high-frequency RF/microwave applications.

Example 2

Fabrication of a High-Speed TFT from a Silicon-On-Insulator Substrate

Figure 6:
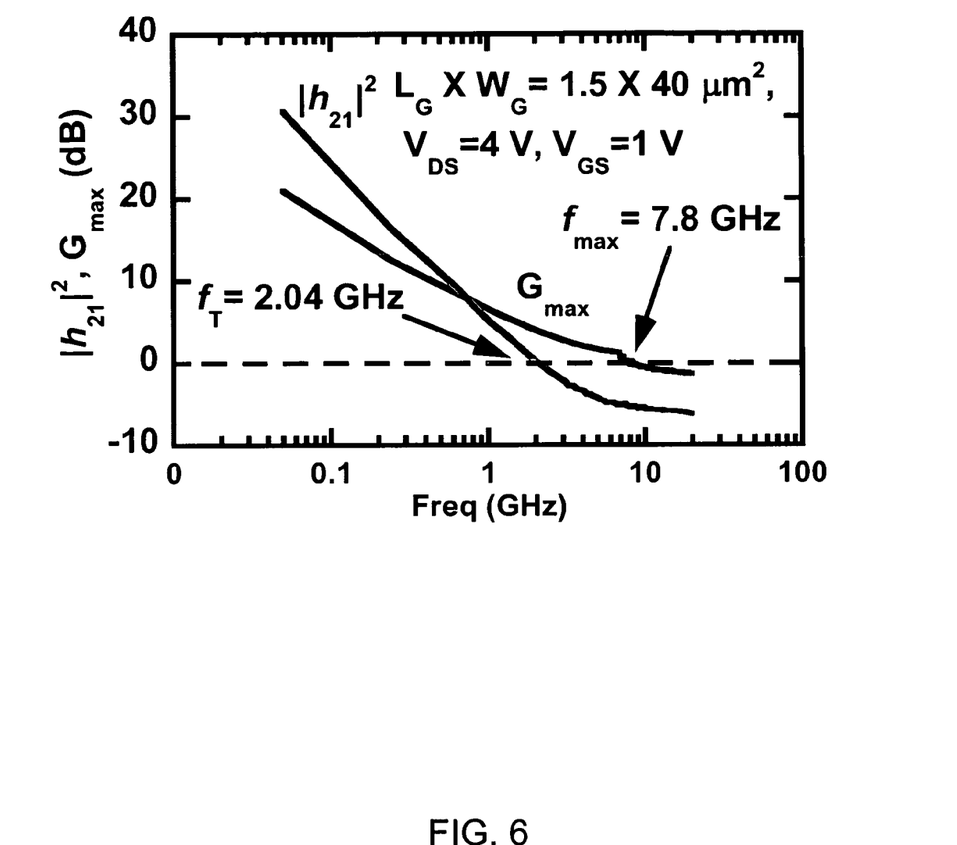
FIG. 6 AC small-signal RF characteristics of a top-gated RF TFT ($L_G$=1.5 µm and $W_G$=40 µm) on polymer substrate. Current gain ($|h_{21}|^2$) and power gain ($G_{max}$) are shown as a function of frequency measured at $V_{DS}$=4 V and $V_{GS}$=1 V.

An N-type TFT with significantly enhanced speed performance ($f_T/f_{max}$=2.04/7.8 GHz), as shown in FIG. 6, was fabricated using the methods described in Example 1, above, with the following modifications to the processing parameters and device layout. The annealing temperature after the source and drain were formed using phosphorus ion implantation was 950° C. and the duration of the anneal was 30 minutes. The thickness of SiO gate dielectric layer was reduced to 100 nm. The ion implanted source and drain region had a reduced separation of 1.5 µm and the length of the gate electrode was increased to 2.5 µm. Although this new layout increased the gate-to-source and gate-to-drain capacitance, the channel length was reduced in comparison to the device layout described in Example 1, so that the $f_T$ was only slightly increased. Of more importance, the source and drain parasitic resistance was 5 times lower than that for the device of Example 1. Therefore, the $f_{max}$ was greatly enhanced. Due to the reduced gate dielectric thickness, transconductance was also improved by a factor about 2. The gate voltage was reduced from 5V to 1V, which was also due to the gate dielectric reduction.

For the purposes of this disclosure and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

It is understood that the invention is not confined to the particular embodiments set forth herein as illustrative, but embraces all such modified forms thereof as come within the scope of the following claims.

What is claimed is:
1. A method for fabricating a TFT from a single crystal silicon substrate having a top surface, the method comprising:
(a) creating a hydrogen implantation layer below the top surface of the silicon substrate, whereby a device layer is defined between the top surface of the substrate and the hydrogen implantation layer;
(b) creating a source region, a drain region and a gate channel region in the device layer;

(c) subsequently splitting the silicon substrate at the hydrogen implantation layer to release the device layer.

2. The method of claim 1, wherein the single crystal silicon substrate is a Si(100) substrate.

3. The method of claim 1, wherein the single crystal silicon substrate is a Si(110) substrate.

4. The method of claim 1, wherein the hydrogen implantation layer is created before the source region, the drain region and the gate channel region are created.

5. The method of claim 1, wherein the source region, the drain region, and the gate channel region are created before the hydrogen implantation layer is created.

6. The method of claim 1, further comprising transferring the released device layer onto a polymer substrate.

7. The method of claim 6, further comprising subsequently depositing a gate dielectric layer over the gate channel region.

8. The method of claim 7, wherein the gate dielectric is deposited at a temperature of no more than about 200° C.

9. The method of claim 7, wherein the gate dielectric is deposited at room temperature.

10. The method of claim 7, wherein the gate dielectric comprises a layer of SiO.

11. The method of claim 1, wherein the device layer has a thickness of no more than about 300 nm.

12. The method of claim 1, wherein the step of splitting the silicon substrate at the hydrogen implantation layer to release the device layer comprises bonding the device layer to a surface oxidized silicon handle wafer and breaking the device layer off at the hydrogen implantation layer.

13. The method of claim 12, further comprising etching away the surface silicon oxide of the handle wafer to release the device layer and transferring the released device layer to an adhesive coated polymer substrate.

14. The method of claim 13, further comprising depositing a gate dielectric over the gate channel region, depositing a gate electrode on the gate dielectric, depositing a source electrode on the source region, and depositing a drain electrode on the drain region.

15. The method of claim 1, wherein the single crystal silicon substrate is a Si(100) or Si(110) substrate.

16. A method for fabricating a TFT from a device substrate comprising (1) a device layer comprising a single crystal semiconductor material and (2) a sacrificial layer supporting the active layer, the method comprising:
 (a) creating a source region, a drain region and a gate channel region in the device layer;
 (b) subsequently releasing the device layer from the sacrificial layer;
 (c) transferring the released device layer to a polymer film substrate;
 (d) subsequently depositing a gate dielectric on the gate channel region, wherein the deposition of the gate dielectric is carried out at a temperature of no more than about 150° C.;
 (e) forming a source electrode on the source region;
 (f) forming a drain electrode on the drain region; and
 (g) forming a gate electrode on the gate dielectric.

17. The method of claim 16, wherein the deposition of the gate dielectric is carried out at a temperature of no more than about 100° C.

18. The method of claim 16, wherein the gate dielectric comprises a layer of SiO.

19. The method of claim 16, wherein the TFT has a maximum frequency of oscillation of at least about 3 GHz.

20. The method of claim 16, wherein the single crystal silicon substrate is a Si(100) or Si(110) substrate.

* * * * *